US012640687B2

US 12,640,687 B2

(12) United States Patent
Honda et al.

(10) Patent No.: US 12,640,687 B2
(45) Date of Patent: May 26, 2026

(54) POWER SUPPLY MODULATION DEVICE, POWER SUPPLY MODULATION METHOD, AND POWER SUPPLY MODULATION-TYPE AMPLIFIER

(71) Applicant: Mitsubishi Electric Corporation, Tokyo (JP)

(72) Inventors: Satoru Honda, Tokyo (JP); Yuji Komatsuzaki, Tokyo (JP); Shuichi Sakata, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 697 days.

(21) Appl. No.: 18/084,945

(22) Filed: Dec. 20, 2022

(65) Prior Publication Data

US 2023/0121001 A1     Apr. 20, 2023

Related U.S. Application Data

(63) Continuation of application No. PCT/JP2020/031203, filed on Aug. 19, 2020.

(51) Int. Cl.
H03F 1/02 (2006.01)
H03F 3/21 (2006.01)

(52) U.S. Cl.
CPC ........... H03F 1/0288 (2013.01); H03F 3/211 (2013.01)

(58) Field of Classification Search
None
See application file for complete search history.

(56) References Cited

U.S. PATENT DOCUMENTS

| | | | |
|---|---|---|---|
| 2004/0263246 A1 | 12/2004 | Robinson et al. | |
| 2011/0199156 A1 | 8/2011 | Hayakawa | |
| 2011/0285460 A1 | 11/2011 | Murao | |
| 2013/0285748 A1* | 10/2013 | Hongo | H03F 3/24 330/291 |
| 2014/0118063 A1* | 5/2014 | Briffa | H03F 1/0288 330/127 |

FOREIGN PATENT DOCUMENTS

| | | |
|---|---|---|
| JP | 2005-20694 A | 1/2005 |
| JP | 2010-114539 A | 5/2010 |
| WO | WO 2010/084544 A1 | 7/2010 |

* cited by examiner

*Primary Examiner* — Andrea Lindgren Baltzell
*Assistant Examiner* — Malane Lieng
(74) *Attorney, Agent, or Firm* — Birch, Stewart, Kolasch & Birch, LLP

(57) ABSTRACT

A power supply modulation device includes a unit detecting, from a first digital signal, a first amplitude being the amplitude of a first analog signal provided to a first amplifier and detecting, from a second digital signal, a second amplitude being the amplitude of a second analog signal provided to a second amplifier; a unit that calculates a time differential value of a ratio of the first amplitude to a sum of the first amplitude and the second amplitude, and determines, on the basis of the time differential value, whether or not output impedance of a combining circuit that combines together the first analog signal amplified and the second analog signal changes along with a change in power of the combined signal; and a unit that controls a power supply voltage supplied to each of the first amplifier and the second amplifier, on the basis of the determination.

8 Claims, 11 Drawing Sheets

FIG. 5

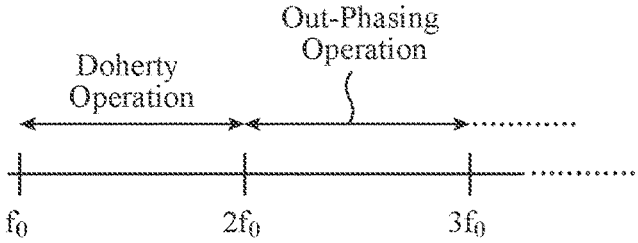

FIG. 6

```
                    ┌─────────┐
                    │  START  │
                    └────┬────┘
            ┌────────────┴────────────┐
            ▼ ST1                     ▼ ST2
┌─────────────────────┐   ┌─────────────────────┐
│ Detect First        │   │ Detect Second       │
│ Amplitude by        │   │ Amplitude by        │
│ First Amplitude     │   │ Second Amplitude    │
│ Detecting Unit      │   │ Detecting Unit      │
└──────────┬──────────┘   └──────────┬──────────┘
           └───────────┬─────────────┘
                       ▼
       ┌───────────────────────────────┐
       │ Determine Whether or          │
       │ Not Output Impedance of       │── ST3
       │ Combining Circuit Changes     │
       └───────────────┬───────────────┘
                       ▼
                  ╱ST4      YES
          ╱─────────────────╲──────────────┐
          ╲ Is Output Impedance╱            │
          ╲ Not Changed?      ╱             │
               ╲────┬────╱                  │
                    │ NO                     │
                    ▼ ST5                     │
   YES      ╱─────────────────╲              │
 ┌─────────╲ Is Obtained       ╱             │
 │          ╲ Amplitude Signal ╱             │
 │          ╲ First Amplitude  ╱             │
 │          ╲ Signal?         ╱              │
 │               ╲───┬───╱                   │
 │                   │ NO  ST7               │ ST8
 ▼ ST6               ▼                        ▼
┌──────────────┐ ┌──────────────┐ ┌──────────────────┐
│ Control Power│ │ Control Power│ │ Fix, by          │
│ Supply       │ │ Supply       │ │ Voltage Setting  │
│ Voltage V by │ │ Voltage V by │ │ Unit, Power      │
│ Voltage      │ │ Voltage      │ │ Supply Voltage V │
│ Setting Unit │ │ Setting Unit │ │ to Voltage       │
│ in Accordance│ │ in Accordance│ │ Outputted from   │
│ with First   │ │ with Second  │ │ Fixed-Voltage    │
│ Amplitude    │ │ Amplitude    │ │ Power Supply     │
└──────┬───────┘ └──────┬───────┘ └────────┬─────────┘
       └───────────────┬┴───────────────────┘
                       ▼
                    ┌─────────┐
                    │   END   │
                    └─────────┘
```

Amplitude of Voltage Outputted from
Fixed-Voltage Power Supply

First Analog Signal or
Second Analog Signal

First Amplitude Mag$_1$ or Second Amplitude Mag$_2$

Doherty Operation

Doherty Operation

Doherty Operation

Doherty Operation

Doherty Operation

Doherty Operation

Out-Phasing Operation

Out-Phasing Operation

Out-Phasing Operation

Out-Phasing Operation

Out-Phasing Operation

Out-Phasing Operation

POWER SUPPLY MODULATION DEVICE, POWER SUPPLY MODULATION METHOD, AND POWER SUPPLY MODULATION-TYPE AMPLIFIER

CROSS REFERENCE TO RELATED APPLICATIONS

This application is a Continuation of PCT International Application No. PCT/JP2020/031203, filed on Aug. 19, 2020, which is hereby expressly incorporated by reference into the present application.

TECHNICAL FIELD

The present disclosure relates to a power supply modulation device, a power supply modulation method, and a power supply modulation-type amplifier.

BACKGROUND ART

A Doherty amplifier generally includes two amplifiers, a 90-degree line, and a combining circuit. One of the two amplifiers is a carrier amplifier that amplifies a first analog signal which is an amplification target signal, regardless of the signal level of the first analog signal. The other amplifier is a peaking amplifier that amplifies a second analog signal which is an amplification target signal, when the signal level of the second analog signal is greater than or equal to a predetermined signal level.

Doherty amplifiers include not only a Doherty amplifier in which one amplifier operates as a carrier amplifier and the other amplifier operates as a peaking amplifier, but also a Doherty amplifier in which the carrier amplifier and the peaking amplifier are switched, for example, depending on the magnitudes of power of amplification target signals, and the one amplifier operates as a peaking amplifier and the other amplifier operates as a carrier amplifier (such a Doherty amplifier is hereinafter referred to as "conventional Doherty amplifier").

The conventional Doherty amplifier can implement high efficiency operations if the signal levels of amplification target signals are in a range in which load modulation occurs in the Doherty amplifier. Occurrence of load modulation indicates that output impedance of the combining circuit changes along with a change in power of an output signal from the combining circuit.

Meanwhile, there is a Doherty amplifier including a power supply modulating unit that detects an envelope of an amplification target signal, and controls a power supply voltage of a carrier amplifier on the basis of the envelope (see, for example, Patent Literature 1).

CITATION LIST

Patent Literatures

Patent Literature 1: WO 2010-084544 A

SUMMARY OF INVENTION

Technical Problem

The conventional Doherty amplifier cannot detect whether or not there is load modulation. Hence, the conventional Doherty amplifier has a problem that it cannot implement an operation of suppressing decrease in efficiency at a time when the signal levels of amplification target signals are low levels at which load modulation does not occur.

Even if the power supply modulating unit in the Doherty amplifier described in Patent Literature 1 is applied to the conventional Doherty amplifier, when the carrier amplifier and the peaking amplifier are switched, a back-off level is not detected depending on whether or not there is load modulation. Hence, the power supply modulating unit cannot perform power supply modulation at the right back-off level, and thus, efficiency at the back-off level or lower cannot be improved.

The present disclosure is made to solve the problem described above, and an object of the present disclosure is to obtain a power supply modulation device, a power supply modulation method, and a power supply modulation-type amplifier that can suppress decrease in efficiency even when load modulation does not occur.

Solution to Problem

A power supply modulation device according to the present disclosure includes processing circuitry to detect a first amplitude from a first digital signal and detect a second amplitude from a second digital signal, the first amplitude being an amplitude of a first analog signal provided to a first amplifier, and the second amplitude being an amplitude of a second analog signal provided to a second amplifier, to calculate a time differential value of a ratio of the first amplitude to a sum of the first amplitude and the second amplitude, and perform determination of, on a basis of the time differential value of the ratio, whether or not output impedance of a combining circuit to obtain a combined signal by combining together the first analog signal amplified by the first amplifier and the second analog signal amplified by the second amplifier changes along with a change in power of the combined signal obtained by the combining circuit, and to control a power supply voltage supplied to each of the first amplifier and the second amplifier, on a basis of a result of the determination.

Advantageous Effects of Invention

According to the present disclosure, even when load modulation does not occur, decrease in efficiency can be suppressed.

BRIEF DESCRIPTION OF DRAWINGS

FIG. 3 is a hardware configuration diagram of a computer for a case in which a part of the power supply modulation device 1 is implemented by software, firmware, or the like.

FIG. 5 is an explanatory diagram showing operating modes of the power supply modulation-type amplifier.

FIG. 6 is a flowchart showing a power supply modulation method which is a processing procedure performed by the power supply modulation device 1 shown in FIG. 1.

DESCRIPTION OF EMBODIMENTS

To describe the present disclosure in more detail, embodiments for carrying out the present disclosure will be described below with reference to the accompanying drawings.

First Embodiment

Figure 1:
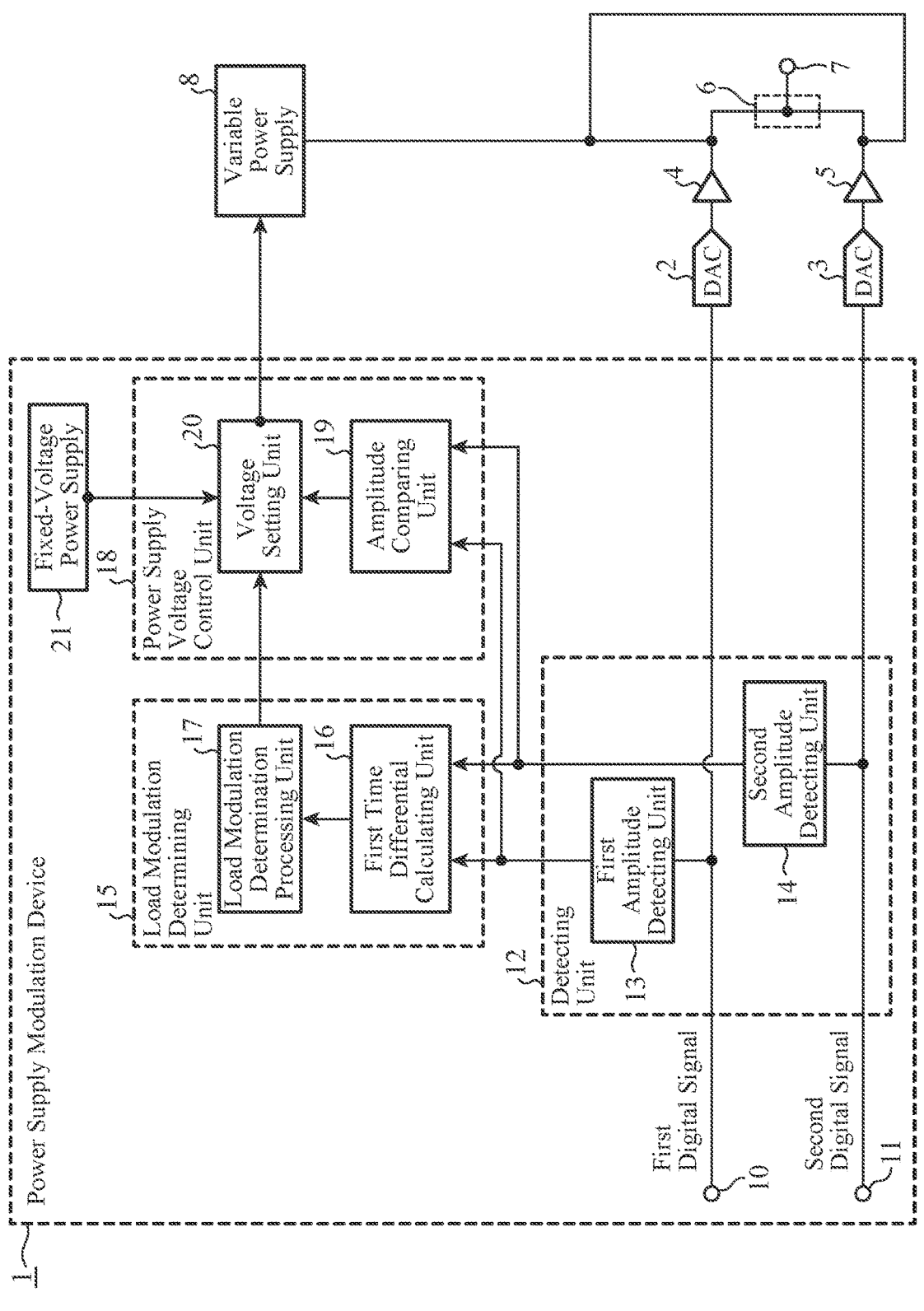
FIG. 1 is a configuration diagram showing a power supply modulation-type amplifier including a power supply modulation device 1 according to a first embodiment.

FIG. 1 is a configuration diagram showing a power supply modulation-type amplifier including a power supply modulation device 1 according to a first embodiment.

Figure 2:
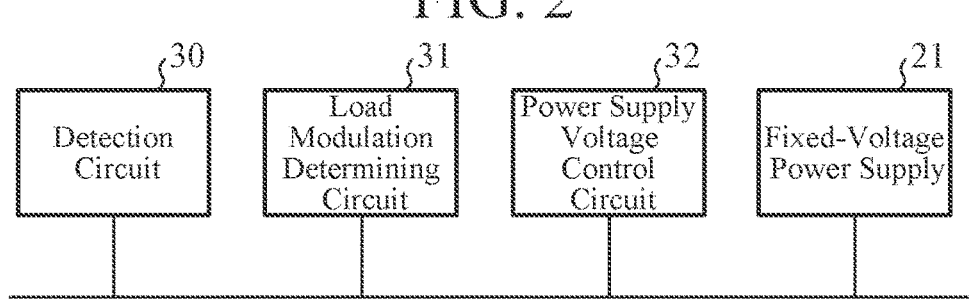
FIG. 2 is a hardware configuration diagram showing hardware of the power supply modulation device 1 according to the first embodiment.

FIG. 2 is a hardware configuration diagram showing hardware of the power supply modulation device 1 according to the first embodiment.

The power supply modulation-type amplifier shown in FIG. 1 includes the power supply modulation device 1, a first digital-to-analog converter (hereinafter, referred to as "first DAC") 2, a second digital-to-analog converter (hereinafter, referred to as "second DAC") 3, a first amplifier 4, a second amplifier 5, a combining circuit 6, an output terminal 7, and a variable power supply 8.

The power supply modulation device 1 includes a first analog signal input terminal 10, a second analog signal input terminal 11, a detecting unit 12, a load modulation determining unit 15, a power supply voltage control unit 18, and a fixed-voltage power supply 21.

The power supply modulation device 1 determines whether or not there is load modulation in the power supply modulation-type amplifier shown in FIG. 1, and controls a power supply voltage supplied from the variable power supply 8 to each of the first amplifier 4 and the second amplifier 5, on the basis of whether or not there is load modulation.

Since the power supply modulation device 1 controls a power supply voltage supplied to each of the first amplifier 4 and the second amplifier 5, on the basis of whether or not there is load modulation, not only when the signal levels of amplification target signals are high levels at which load modulation occurs, but also when the signal levels are low levels at which load modulation does not occur, decrease in efficiency can be suppressed.

In the power supply modulation-type amplifier shown in FIG. 1, not only the first amplifier 4 operates as a carrier amplifier and the second amplifier 5 operates as a peaking amplifier, but also the carrier amplifier and the peaking amplifier are switched, for example, depending on the magnitudes of power of amplification target signals. Namely, in the power supply modulation-type amplifier shown in FIG. 1, the first amplifier 4 may operate as a peaking amplifier and the second amplifier 5 may operate as a carrier amplifier.

The first DAC 2 converts a first digital signal which is an amplification target signal to a first analog signal, and outputs the first analog signal to the first amplifier 4.

The second DAC 3 converts a second digital signal which is an amplification target signal to a second analog signal, and outputs the second analog signal to the second amplifier 5.

The first amplifier 4 is implemented by, for example, a field effect transistor (FET), a heterojunction bipolar transistor (HBT), or a high electron mobility transistor (HEMT).

The first amplifier 4 amplifies the first analog signal outputted from the first DAC 2, and outputs the amplified first analog signal to the combining circuit 6.

The second amplifier 5 is implemented by, for example, a FET, an HBT, or a HEMT.

The second amplifier 5 amplifies the second analog signal outputted from the second DAC 3, and outputs the amplified second analog signal to the combining circuit 6.

For example, if the power of the first analog signal is greater than or equal to the power of the second analog signal, then the first amplifier 4 operates as a carrier amplifier and the second amplifier 5 operates as a peaking amplifier. If the power of the first analog signal is smaller than the power of the second analog signal, then the first amplifier 4 operates as a peaking amplifier and the second amplifier 5 operates as a carrier amplifier.

The combining circuit 6 combines together the first analog signal amplified by the first amplifier 4 and the second analog signal amplified by the second amplifier 5, and outputs the combined signal to the output terminal 7.

The output terminal 7 is a terminal for outputting the signal combined by the combining circuit 6 to an external source.

The variable power supply 8 supplies a power supply voltage to each of the first amplifier 4 and the second amplifier 5.

The first analog signal input terminal 10 is a terminal to which the first digital signal which is an amplification target signal is provided.

The second analog signal input terminal 11 is a terminal to which the second digital signal which is an amplification target signal is provided.

The detecting unit 12 is implemented by, for example, a detection circuit 30 shown in FIG. 2.

The detecting unit 12 includes a first amplitude detecting unit 13 and a second amplitude detecting unit 14.

The detecting unit 12 detects a first amplitude which is the amplitude of the first analog signal provided to the first amplifier 4, from the first digital signal provided to the first analog signal input terminal 10.

The detecting unit 12 detects a second amplitude which is the amplitude of the second analog signal provided to the second amplifier 5, from the second digital signal provided to the second analog signal input terminal 11.

The first amplitude detecting unit 13 detects a first amplitude on the basis of the first digital signal provided to the first analog signal input terminal 10, and outputs a first amplitude signal indicating the first amplitude to each of a first time differential calculating unit 16 which will be described later and an amplitude comparing unit 19 which will be described later.

The second amplitude detecting unit 14 detects a second amplitude on the basis of the second digital signal provided to the second analog signal input terminal 11, and outputs a second amplitude signal indicating the second amplitude to each of the first time differential calculating unit 16 and the amplitude comparing unit 19.

The load modulation determining unit 15 is implemented by, for example, a load modulation determining circuit 31 shown in FIG. 2.

The load modulation determining unit 15 includes the first time differential calculating unit 16 and a load modulation determination processing unit 17.

The load modulation determining unit 15 determines whether or not load modulation occurs in the power supply modulation-type amplifier shown in FIG. 1.

Namely, the load modulation determining unit 15 calculates a time differential value of a ratio of the first amplitude detected by the detecting unit 12 to a sum of the first amplitude and the second amplitude detected by the detecting unit 12.

The load modulation determining unit 15 determines, on the basis of the time differential value of the ratio, whether or not the output impedance of the combining circuit 6 changes along with a change in power of the signal combined by the combining circuit 6.

The load modulation determining unit 15 outputs a result of the determination indicating whether or not the output impedance of the combining circuit 6 changes, to the power supply voltage control unit 18 which will be described later.

The first time differential calculating unit 16 calculates a sum of the first amplitude indicated by the first amplitude signal outputted from the first amplitude detecting unit 13 and the second amplitude indicated by the second amplitude signal outputted from the second amplitude detecting unit 14 (hereinafter, referred to as "amplitude sum").

The first time differential calculating unit 16 calculates a ratio of the first amplitude to the amplitude sum and calculates a time differential value of the ratio.

The first time differential calculating unit 16 outputs the time differential value of the ratio to the load modulation determination processing unit 17.

If the time differential value calculated by the first time differential calculating unit 16 is 0, then the load modulation determination processing unit 17 determines that load modulation does not occur. That is, it is determined that the output impedance of the combining circuit 6 does not change.

If the time differential value calculated by the first time differential calculating unit 16 is not 0, then the load modulation determination processing unit 17 determines that load modulation occurs. That is, it is determined that the output impedance of the combining circuit 6 changes.

The load modulation determination processing unit 17 outputs a result of the determination indicating whether or not the output impedance of the combining circuit 6 changes, to a voltage setting unit 20 which will be described later.

The power supply voltage control unit 18 is implemented by, for example, a power supply voltage control circuit 32 shown in FIG. 2.

The power supply voltage control unit 18 includes the amplitude comparing unit 19 and the voltage setting unit 20.

The power supply voltage control unit 18 controls a power supply voltage supplied to each of the first amplifier 4 and the second amplifier 5, on the basis of the result of the determination by the load modulation determining unit 15.

Namely, when the load modulation determining unit 15 determines that the output impedance changes, the power supply voltage control unit 18 fixes a power supply voltage supplied from the variable power supply 8.

When the load modulation determining unit 15 determines that the output impedance does not change, the power supply voltage control unit 18 controls a power supply voltage supplied from the variable power supply 8, in accordance with a greater one of the first amplitude and the second amplitude.

The amplitude comparing unit 19 compares the first amplitude indicated by the first amplitude signal outputted from the first amplitude detecting unit 13 with the second amplitude indicated by the second amplitude signal outputted from the second amplitude detecting unit 14.

If the first amplitude is greater than or equal to the second amplitude, then the amplitude comparing unit 19 outputs the first amplitude signal to the voltage setting unit 20.

If the first amplitude is smaller than the second amplitude, then the amplitude comparing unit 19 outputs the second amplitude signal to the voltage setting unit 20.

If the result of the determination outputted from the load modulation determination processing unit 17 indicates that the output impedance changes, then the voltage setting unit 20 fixes a power supply voltage supplied from the variable power supply 8 to a voltage outputted from the fixed-voltage power supply 21.

If the result of the determination outputted from the load modulation determination processing unit 17 indicates that the output impedance does not change, then the voltage setting unit 20 controls a power supply voltage supplied from the variable power supply 8, in accordance with the first amplitude indicated by the first amplitude signal or the second amplitude indicated by the second amplitude signal that is outputted from the amplitude comparing unit 19.

The fixed-voltage power supply 21 outputs a fixed voltage to the voltage setting unit 20.

In FIG. 1, it is assumed that each of the detecting unit 12, the load modulation determining unit 15, the power supply voltage control unit 18, and the fixed-voltage power supply 21 which are components of the power supply modulation device 1 is implemented by dedicated hardware such as that shown in FIG. 2. Namely, it is assumed that the power supply modulation device 1 is implemented by the detection circuit 30, the load modulation determining circuit 31, the power supply voltage control circuit 32, and the fixed-voltage power supply 21.

Each of the detection circuit 30, the load modulation determining circuit 31, and the power supply voltage control circuit 32 corresponds, for example, to a single circuit, a composite circuit, a programmed processor, a parallel programmed processor, an application specific integrated circuit (ASIC), a field-programmable gate array (FPGA), or a combination thereof.

The components of the power supply modulation device 1 are not limited to being implemented by dedicated hardware, and may be implemented by software, firmware, or a combination of software and firmware.

The software or firmware is stored as a program in a memory of a computer. The computer refers to hardware that executes the program, and corresponds, for example, to a central processing unit (CPU), a central processor, a processing unit, an arithmetic unit, a microprocessor, a microcomputer, a processor, or a digital signal processor (DSP).

Figure 3:
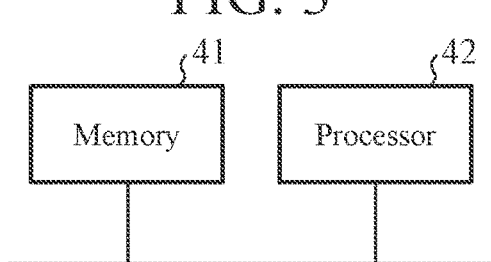

FIG. 3 is a hardware configuration diagram of a computer for a case in which a part of the power supply modulation device 1 is implemented by software, firmware, or the like.

When a part of the power supply modulation device 1 is implemented by software, firmware, or the like, a program for causing a computer to perform a processing procedure performed by each of the detecting unit 12, the load modulation determining unit 15, and the power supply voltage control unit 18 is stored in a memory 41. Then, a processor 42 of the computer executes the program stored in the memory 41.

In addition, FIG. 2 shows an example in which each of the components of the power supply modulation device 1 is implemented by dedicated hardware, and FIG. 3 shows an example in which a part of the power supply modulation device 1 is implemented by software, firmware, or the like. However, they are merely examples, and some of the detecting unit 12, the load modulation determining unit 15, and the power supply voltage control unit 18 which are components of the power supply modulation device 1 may be implemented by dedicated hardware and the other components may be implemented by software, firmware, or the like.

Figure 4:
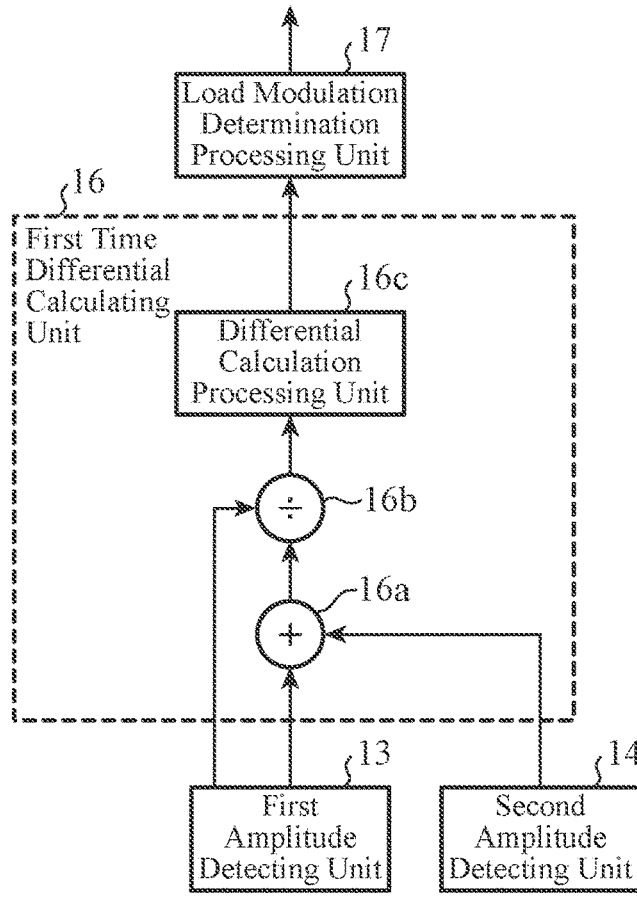
FIG. 4 is a configuration diagram showing the inside of a first time differential calculating unit 16.

FIG. 4 is a configuration diagram showing the inside of the first time differential calculating unit 16.

The first time differential calculating unit 16 includes an adding unit 16a, a dividing unit 16b, and a differential calculation processing unit 16c.

The adding unit 16a adds up a first amplitude $Mag_1$ indicated by a first amplitude signal outputted from the first amplitude detecting unit 13 and a second amplitude $Mag_2$ indicated by a second amplitude signal outputted from the second amplitude detecting unit 14, thereby calculating an amplitude sum $\Sigma Mag$.

The adding unit 16a outputs the amplitude sum $\Sigma Mag$ to the dividing unit 16b.

The dividing unit 16b calculates a ratio $P_{ratio}$ of the first amplitude $Mag_1$ to the amplitude sum $\Sigma Mag$ outputted from the adding unit 16a.

The dividing unit 16b outputs the ratio $P_{ratio}$ to the differential calculation processing unit 16c.

The differential calculation processing unit 16c calculates a time differential value $Del_1$ of the ratio $P_{ratio}$ outputted from the dividing unit 16b.

The differential calculation processing unit 16c outputs the time differential value $Del_1$ to the load modulation determination processing unit 17.

Next, operations of the power supply modulation-type amplifier shown in FIG. 1 will be described.

FIG. 5 is an explanatory diagram showing operating modes of the power supply modulation-type amplifier.

FIG. 5 shows that the power supply modulation-type amplifier performs a Doherty operation in a range in which a frequency f of each of a first analog signal and a second analog signal is greater than or equal to a fundamental frequency $f_0$ and is less than or equal to a double frequency $2f_0$.

In addition, FIG. 5 shows that the power supply modulation-type amplifier performs an out-phasing operation in a range in which the frequency f is greater than the double frequency $2f_0$ and is less than or equal to a triple frequency $3f_0$.

The power supply modulation device 1 shown in FIG. 1 can suppress decrease in efficiency at a time when a Doherty operation is performed.

FIG. 6 is a flowchart showing a power supply modulation method which is a processing procedure performed by the power supply modulation device 1 shown in FIG. 1.

The first amplitude detecting unit 13 obtains a first digital signal provided to the first analog signal input terminal 10.

The first amplitude detecting unit 13 detects a first amplitude $Mag_1$ which is the amplitude of a first analog signal outputted from the first DAC 2 to the first amplifier 4, on the basis of the first digital signal (step ST1 of FIG. 6). A process itself of detecting the first amplitude from the first digital signal is a known technique and thus a detailed description thereof is omitted.

The first amplitude detecting unit 13 outputs a first amplitude signal indicating the first amplitude $Mag_1$ to each of the first time differential calculating unit 16 and the amplitude comparing unit 19.

The second amplitude detecting unit 14 obtains a second digital signal provided to the second analog signal input terminal 11.

The second amplitude detecting unit 14 detects a second amplitude $Mag_2$ which is the amplitude of a second analog signal outputted from the second DAC 3 to the second amplifier 5, on the basis of the second digital signal (step ST2 of FIG. 6).

The second amplitude detecting unit 14 outputs a second amplitude signal indicating the second amplitude $Mag_2$ to each of the first time differential calculating unit 16 and the amplitude comparing unit 19.

The load modulation determining unit 15 determines whether or not load modulation occurs in the power supply modulation-type amplifier shown in FIG. 1. That is, it is determined whether or not the output impedance of the combining circuit 6 changes along with a change in power of an output signal from the combining circuit 6 (step ST3 of FIG. 6).

A determination process performed by the load modulation determining unit 15 will be specifically described below.

First, the adding unit 16a obtains the first amplitude signal from the first amplitude detecting unit 13 and obtains the second amplitude signal from the second amplitude detecting unit 14.

As shown in the following equation (1), the adding unit 16a adds up the first amplitude $Mag_1$ indicated by the first amplitude signal and the second amplitude $Mag_2$ indicated by the second amplitude signal, thereby calculating an amplitude sum $\Sigma Mag$:

$$\Sigma Mag = Mag_1 + Mag_2 \quad (1)$$

The adding unit 16a outputs the amplitude sum $\Sigma Mag$ to the dividing unit 16b.

The dividing unit 16b obtains the first amplitude signal from the first amplitude detecting unit 13 and obtains the amplitude sum $\Sigma Mag$ from the adding unit 16a.

The dividing unit 16b calculates a ratio $P_{ratio}$ of the first amplitude $Mag_1$ to the amplitude sum $\Sigma Mag$ outputted from the adding unit 16a as shown in the following equation (2):

$$P_{ratio} = \frac{Mag_1}{\sum Mag} \quad (2)$$

The dividing unit 16b outputs the ratio $P_{ratio}$ to the differential calculation processing unit 16c.

The differential calculation processing unit 16c obtains the ratio $P_{ratio}$ from the dividing unit 16b.

The differential calculation processing unit 16c calculates a time differential value $Del_1$ of the ratio $P_{ratio}$. A process itself of calculating the time differential value $Del_1$ is a known technique and thus a detailed description thereof is omitted.

The differential calculation processing unit 16c outputs the time differential value $Del_1$ to the load modulation determination processing unit 17.

If the time differential value $Del_1$ calculated by the first time differential calculating unit 16 is 0, then the load modulation determination processing unit 17 determines that load modulation does not occur. That is, it is determined that the output impedance of the combining circuit 6 does not change.

If the time differential value $Del_1$ calculated by the first time differential calculating unit 16 is not 0, then the load modulation determination processing unit 17 determines that load modulation occurs. That is, it is determined that the output impedance of the combining circuit 6 changes.

The load modulation determination processing unit 17 outputs a result of the determination J indicating whether or not the output impedance of the combining circuit 6 changes, to the voltage setting unit 20.

The amplitude comparing unit 19 obtains the first amplitude signal from the first amplitude detecting unit 13 and obtains the second amplitude signal from the second amplitude detecting unit 14.

The amplitude comparing unit 19 compares the first amplitude $Mag_1$ indicated by the first amplitude signal with the second amplitude $Mag_2$ indicated by the second amplitude signal.

If the first amplitude $Mag_1$ is greater than or equal to the second amplitude $Mag_2$, then the amplitude comparing unit 19 outputs the first amplitude signal to the voltage setting unit 20.

If the first amplitude $Mag_1$ is smaller than the second amplitude $Mag_2$, then the amplitude comparing unit 19 outputs the second amplitude signal to the voltage setting unit 20.

The voltage setting unit 20 obtains the result of the determination J from the load modulation determination processing unit 17.

The voltage setting unit 20 obtains the first amplitude signal or the second amplitude signal from the amplitude comparing unit 19.

When the result of the determination J indicates that the output impedance does not change (when NO at step ST4 of FIG. 6), if the obtained amplitude signal is the first amplitude signal (when YES at step ST5 of FIG. 6), then the voltage setting unit 20 controls a power supply voltage V supplied from the variable power supply 8 to each of the first amplifier 4 and the second amplifier 5, in accordance with the first amplitude $Mag_1$ indicated by the first amplitude signal (step ST6 of FIG. 6).

Figure 7:
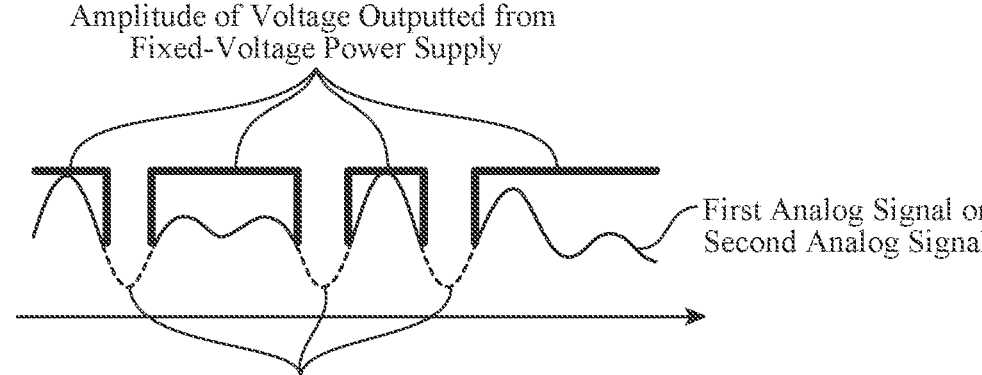
FIG. 7 is an explanatory diagram showing exemplary control of a power supply voltage V by a voltage setting unit 20.

Namely, as shown in FIG. 7, the voltage setting unit 20 controls the power supply voltage V supplied from the variable power supply 8 to each of the first amplifier 4 and the second amplifier 5 in such a manner that the amplitude of the power supply voltage V is the first amplitude $Mag_1$.

When the result of the determination J indicates that the output impedance does not change (when NO at step ST4 of FIG. 6), if the obtained amplitude signal is the second amplitude signal (when NO at step ST5 of FIG. 6), then the voltage setting unit 20 controls a power supply voltage V supplied from the variable power supply 8 to each of the first amplifier 4 and the second amplifier 5, in accordance with the second amplitude $Mag_2$ indicated by the second amplitude signal (step ST7 of FIG. 6).

Namely, as shown in FIG. 7, the voltage setting unit 20 controls the power supply voltage V supplied from the variable power supply 8 to each of the first amplifier 4 and the second amplifier 5 in such a manner that the amplitude of the power supply voltage V is the second amplitude $Mag_2$.

FIG. 7 is an explanatory diagram showing exemplary control of the power supply voltage V by the voltage setting unit 20. In FIG. 7, a broken line indicates that the amplitude of the power supply voltage V is the first amplitude $Mag_1$ or the second amplitude $Mag_2$.

If the result of the determination J indicates that the output impedance changes (when YES at step ST4 of FIG. 6), then the voltage setting unit 20 fixes a power supply voltage V supplied from the variable power supply 8 to each of the first amplifier 4 and the second amplifier 5, to a voltage outputted from the fixed-voltage power supply 21 (step ST8 of FIG. 6).

Namely, as shown in FIG. 7, the voltage setting unit 20 controls the power supply voltage V supplied from the variable power supply 8 to each of the first amplifier 4 and the second amplifier 5 in such a manner that the power supply voltage V is a voltage outputted from the fixed-voltage power supply 21.

The amplitude of the voltage outputted from the fixed-voltage power supply 21 is greater than each of the first amplitude $Mag_1$ and the second amplitude $Mag_2$. In FIG. 7, a solid line indicates that the power supply voltage V is a voltage outputted from the fixed-voltage power supply 21.

The first DAC 2 converts the first digital signal provided to the first analog signal input terminal 10 to a first analog signal, and outputs the first analog signal to the first amplifier 4.

The second DAC 3 converts the second digital signal provided to the second analog signal input terminal 11 to a second analog signal, and outputs the second analog signal to the second amplifier 5.

The power supply voltage V outputted from the variable power supply 8 is applied as a bias voltage to a drain terminal of the first amplifier 4.

With the power supply voltage V being applied to the drain terminal, the first amplifier 4 amplifies the first analog signal outputted from the first DAC 2 and outputs the amplified first analog signal to the combining circuit 6.

The power supply voltage V outputted from the variable power supply 8 is applied as a bias voltage to a drain terminal of the second amplifier 5.

With the power supply voltage V being applied to the drain terminal, the second amplifier 5 amplifies the second analog signal outputted from the second DAC 3 and outputs the amplified second analog signal to the combining circuit 6.

The combining circuit 6 combines together the first analog signal amplified by the first amplifier 4 and the second analog signal amplified by the second amplifier 5, and outputs the combined signal to the output terminal 7.

FIG. 8 is an explanatory diagram showing relationships between output power obtained when the power supply modulation-type amplifier shown in FIG. 1 performs a Doherty operation, and the amplitude, phase, and the like, of each of a first analog signal and a second analog signal.

In FIG. 8, the output power is standardized and changes in a range of 0 to 1. When the output power is 0.5, a back-off point is reached.

Figure 8A:
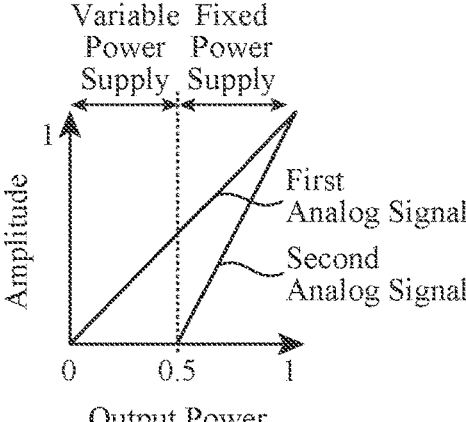
FIG. 8A is an explanatory diagram showing a relationship between the output power of the power supply modulation-type amplifier and a first amplitude $Mag_1$ of a first analog signal and a second amplitude $Mag_2$ of a second analog signal.

FIG. 8A shows a relationship between the output power of the power supply modulation-type amplifier and a first amplitude $Mag_1$ of the first analog signal and a second amplitude $Mag_2$ of the second analog signal.

At the time of low power with the output power being lower than the back-off point, as shown in FIG. 8A, a power supply voltage V whose amplitude is identical to the first amplitude $Mag_1$ or the second amplitude $Mag_2$ is applied to the drain terminal of each of the first amplifier 4 and the second amplifier 5. In addition, at the time of high power with the output power being higher than the back-off point, as shown in FIG. 8A, a power supply voltage V identical to a voltage outputted from the fixed-voltage power supply 21 is applied to the drain terminal of each of the first amplifier 4 and the second amplifier 5.

The first amplifier 4 amplifies the first analog signal at the time of both low power and high power.

The second amplifier 5 amplifies the second analog signal only at the time of high power, and does not amplifies the second analog signal at the time of low power.

Figure 8D:
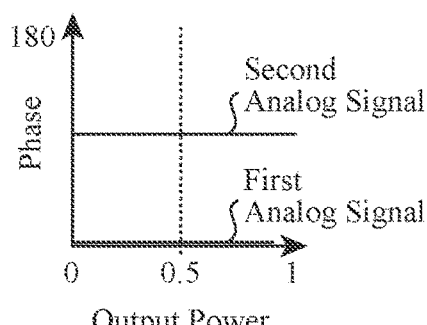
FIG. 8D is an explanatory diagram showing a relationship between the output power of the power supply modulation-type amplifier and a first phase $\theta_1$ of the first analog signal and a second phase $\theta_2$ of the second analog signal.
Figure 8B:
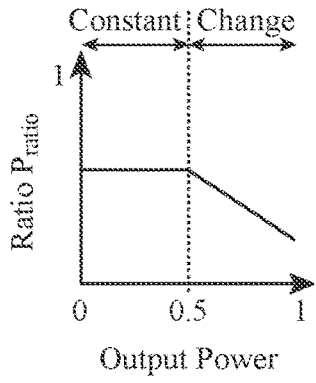
FIG. 8B is an explanatory diagram showing a relationship between the output power of the power supply modulation-type amplifier and a ratio $P_{ratio}$ of the first amplitude $Mag_1$ to an amplitude sum $\Sigma Mag$.

FIG. 8B shows a relationship between the output power of the power supply modulation-type amplifier and a ratio $P_{ratio}$ of the first amplitude $Mag_1$ to an amplitude sum $\Sigma Mag$.

At the time of low power with the output power being lower than the back-off point, as shown in FIG. 8B, the ratio $P_{ratio}$ is constant.

At the time of high power with the output power being higher than the back-off point, as shown in FIG. 8B, the ratio $P_{ratio}$ changes.

Figure 8E:
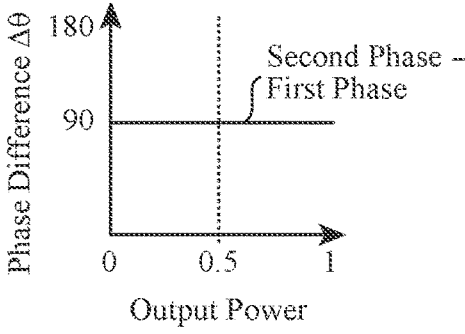
FIG. 8E is an explanatory diagram showing a relationship between the output power of the power supply modulation-type amplifier and a phase difference $\Delta\theta$.
Figure 8C:
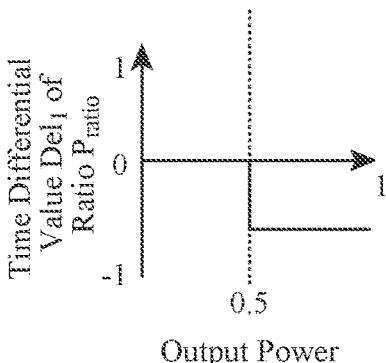
FIG. 8C is an explanatory diagram showing a relationship between the output power of the power supply modulation-type amplifier and a time differential value $Del_1$ of the ratio $P_{ratio}$.

FIG. 8C shows a relationship between the output power of the power supply modulation-type amplifier and a time differential value $Del_1$ of the ratio $P_{ratio}$.

At the time of low power with the output power being lower than the back-off point, as shown in FIG. 8C, the time differential value $Del_1$ is 0 and load modulation does not occur.

At the time of high power with the output power being higher than the back-off point, as shown in FIG. 8C, the time differential value $Del_1$ is not 0 and load modulation occurs.

FIG. 8D shows a relationship between the output power of the power supply modulation-type amplifier and a first phase $\theta_1$ of the first analog signal and a second phase $\theta_2$ of the second analog signal.

Even if the output power of the power supply modulation-type amplifier changes, as shown in FIG. 8D, each of the first phase $\theta_1$ and the second phase $\theta_2$ is constant.

FIG. 8E shows a relationship between the output power of the power supply modulation-type amplifier and a phase difference $\Delta\theta$.

Even if the output power of the power supply modulation-type amplifier changes, as shown in FIG. 8E, the phase difference $\Delta\theta$ between the first phase $\theta_1$ and the second phase $\theta_2$ is constant.

Figure 8F:
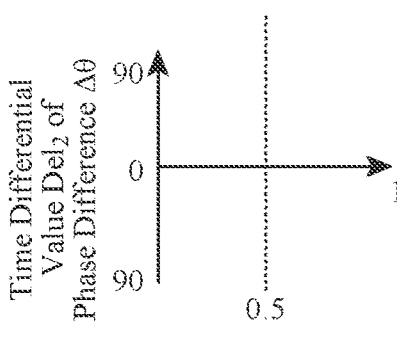
FIG. 8F is an explanatory diagram showing a relationship between the output power of the power supply modulation-type amplifier and a time differential value Deb of the phase difference $\Delta\theta$.

FIG. 8F shows a relationship between the output power of the power supply modulation-type amplifier and a time differential value $Del_2$ of the phase difference $\Delta\theta$.

Even if the output power of the power supply modulation-type amplifier changes, as shown in FIG. 8F, the time differential value $Del_2$ of the phase difference $\Delta\theta$ is 0.

Figure 9:
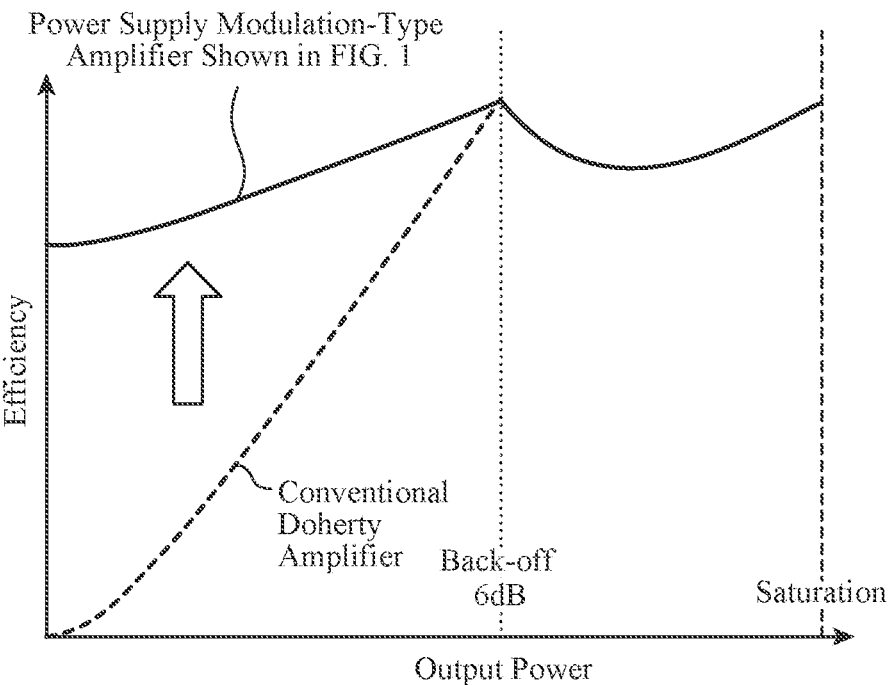
FIG. 9 is an explanatory diagram showing a relationship between output power obtained when the power supply modulation-type amplifier shown in FIG. 1 performs a Doherty operation, and the efficiency of the power supply modulation-type amplifier shown in FIG. 1.

FIG. 9 is an explanatory diagram showing a relationship between output power obtained when the power supply modulation-type amplifier shown in FIG. 1 performs a Doherty operation, and the efficiency of the power supply modulation-type amplifier shown in FIG. 1.

FIG. 9 also shows the efficiency of the conventional Doherty amplifier described in the background art section, in addition to the efficiency of the power supply modulation-type amplifier shown in FIG. 1.

At the time of high power with the output power being higher than the back-off point, the power supply modulation-type amplifier shown in FIG. 1 and the conventional Doherty amplifier have substantially the same high efficiency.

At the time of low power with the output power being lower than the back-off point, the efficiency of the conventional Doherty amplifier is greatly reduced compared with that at the time of high power with the output power being higher than the back-off point. In the power supply modulation-type amplifier shown in FIG. 1, the power supply voltage V is controlled in accordance with a greater one of the first amplitude $Mag_1$ and the second amplitude $Mag_2$, and thus, decrease in efficiency at the time of low power is suppressed compared with the conventional Doherty amplifier.

In the first embodiment described above, the power supply modulation device 1 is configured to include the detecting unit 12 that detects, from a first digital signal, a first amplitude which is the amplitude of a first analog signal provided to the first amplifier 4 and detects, from a second digital signal, a second amplitude which is the amplitude of a second analog signal provided to the second amplifier 5; the load modulation determining unit 15 that calculates a time differential value of a ratio of the first amplitude detected by the detecting unit 12 to a sum of the first amplitude and the second amplitude detected by the detecting unit 12, and determines, on the basis of the time differential value of the ratio, whether or not output impedance of the combining circuit 6 that combines together the first analog signal amplified by the first amplifier 4 and the second analog signal amplified by the second amplifier 5 changes along with a change in power of the signal combined by the combining circuit 6; and the power supply voltage control unit 18 that controls a power supply voltage supplied to each of the first amplifier 4 and the second amplifier 5, on the basis of a result of the determination by the load modulation determining unit 15. Thus, the power supply modulation device 1 can suppress decrease in efficiency even when load modulation does not occur.

In the power supply modulation device 1 shown in FIG. 1, by the load modulation determining unit 15 and the power supply voltage control unit 18 performing digital signal processing, a power supply voltage supplied to each of the first amplifier 4 and the second amplifier 5 is controlled. However, this is merely an example, and a power supply voltage supplied to each of the first amplifier 4 and the second amplifier 5 may be controlled by the load modulation determining unit 15 and the power supply voltage control unit 18 performing analog signal processing.

Second Embodiment

In a second embodiment, a power supply modulation-type amplifier will be described in which a power supply modulation device 1 includes a load modulation determining unit 53 that determines, from a phase of each of a first analog signal and a second analog signal, whether or not output impedance of the combining circuit 6 changes along with a change in power of a signal combined by the combining circuit 6.

Figure 10:
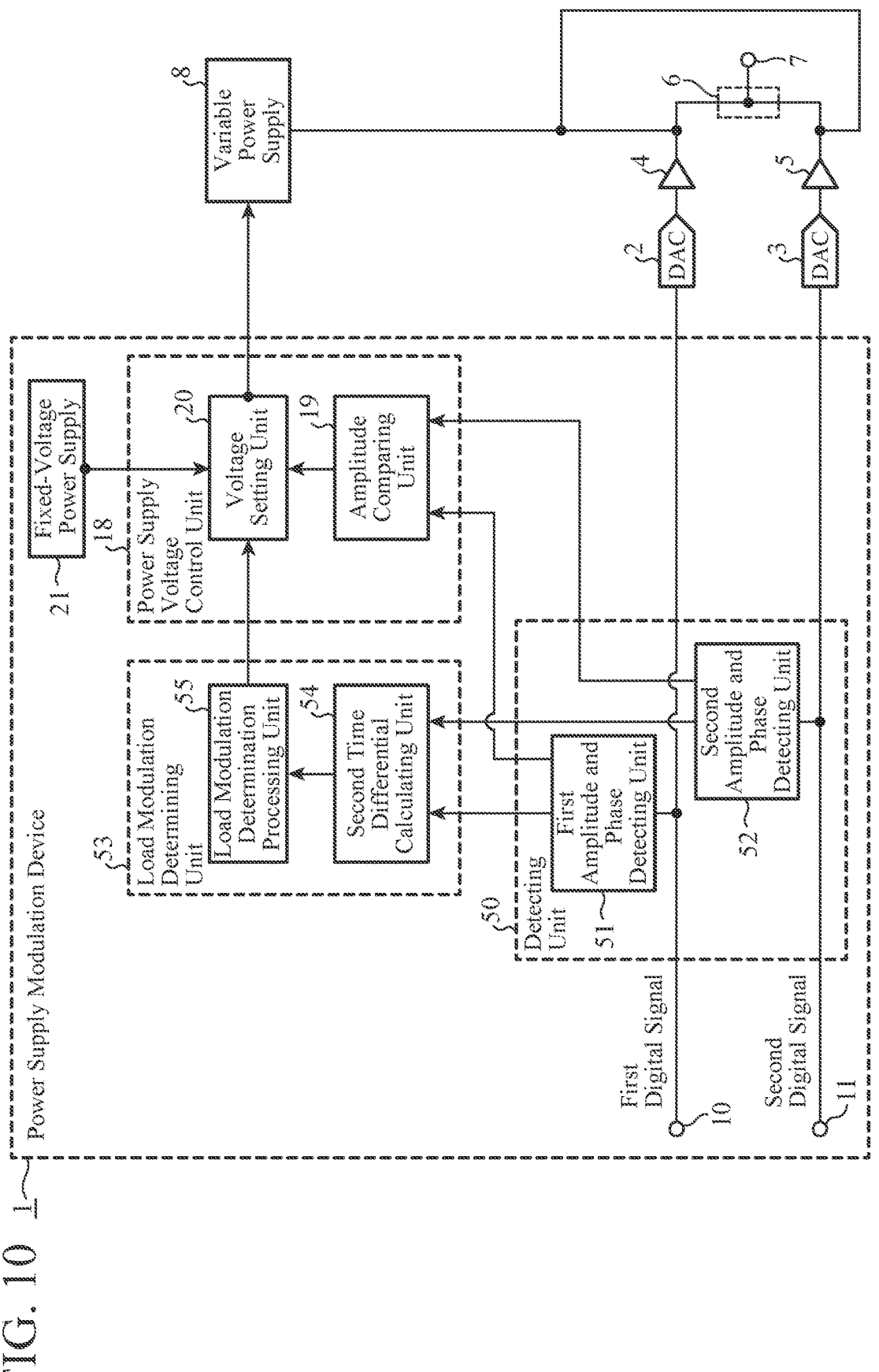
FIG. 10 is a configuration diagram showing a power supply modulation-type amplifier including a power supply modulation device 1 according to a second embodiment.

FIG. 10 is a configuration diagram showing the power supply modulation-type amplifier including the power supply modulation device 1 according to the second embodiment. In FIG. 10, the same reference signs as those of FIG. 1 indicate the same or corresponding portions and thus description thereof is omitted.

Figure 11:
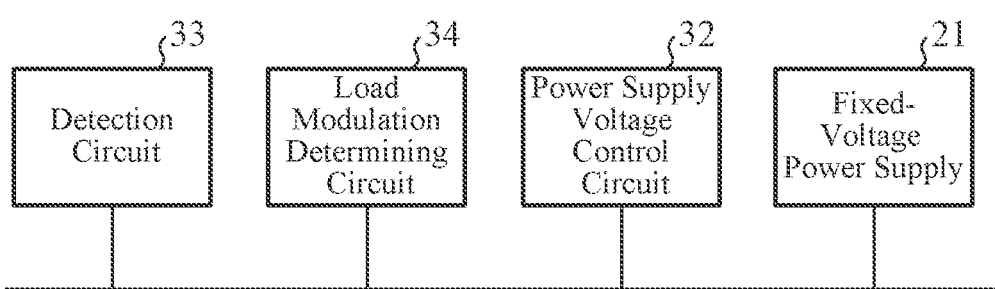
FIG. 11 is a hardware configuration diagram showing hardware of the power supply modulation device 1 according to the second embodiment.

FIG. 11 is a hardware configuration diagram showing hardware of the power supply modulation device 1 according to the second embodiment. In FIG. 11, the same reference signs as those of FIG. 2 indicate the same or corresponding portions and thus description thereof is omitted.

A detecting unit 50 is implemented by, for example, a detection circuit 33 shown in FIG. 11.

The detecting unit 50 includes a first amplitude and phase detecting unit 51 and a second amplitude and phase detecting unit 52.

The detecting unit 50 detects, from a first digital signal provided to the first analog signal input terminal 10, a first phase which is the phase of a first analog signal, in addition to detecting a first amplitude.

The detecting unit 50 detects, from a second digital signal provided to the second analog signal input terminal 11, a second phase which is the phase of a second analog signal, in addition to detecting a second amplitude.

The first amplitude and phase detecting unit 51 detects each of the amplitude and phase of the first analog signal, on the basis of the first digital signal provided to the first analog signal input terminal 10.

The first amplitude and phase detecting unit 51 outputs a first amplitude signal indicating the first amplitude to the amplitude comparing unit 19, and outputs a first phase signal indicating the first phase to a second time differential calculating unit 54.

The second amplitude and phase detecting unit 52 detects each of the amplitude and phase of the second analog signal, on the basis of the second digital signal provided to the second analog signal input terminal 11.

The second amplitude and phase detecting unit 52 outputs a second amplitude signal indicating the second amplitude to the amplitude comparing unit 19, and outputs a second phase signal indicating the second phase to the second time differential calculating unit 54.

The load modulation determining unit 53 is implemented by a load modulation determining circuit 34 shown in FIG. 11.

The load modulation determining unit 53 includes the second time differential calculating unit 54 and a load modulation determination processing unit 55.

The load modulation determining unit 53 determines whether or not load modulation occurs in the power supply modulation-type amplifier shown in FIG. 10.

Namely, the load modulation determining unit 53 calculates a time differential value of a phase difference between the first phase detected by the detecting unit 50 and the second phase detected by the detecting unit 50.

The load modulation determining unit 53 determines, on the basis of the time differential value of the phase difference, whether or not the output impedance of the combining circuit 6 changes along with a change in power of a signal combined by the combining circuit 6.

The load modulation determining unit 53 outputs a result of the determination indicating whether or not the output impedance of the combining circuit 6 changes, to the power supply voltage control unit 18.

The second time differential calculating unit 54 calculates a phase difference between the first phase indicated by the first phase signal outputted from the first amplitude and phase detecting unit 51 and the second phase indicated by the second phase signal outputted from the second amplitude and phase detecting unit 52.

The second time differential calculating unit 54 calculates a time differential value of the calculated phase difference.

The second time differential calculating unit 54 outputs the time differential value of the phase difference to the load modulation determination processing unit 55.

If the time differential value calculated by the second time differential calculating unit 54 is 0, then the load modulation determination processing unit 55 determines that load modulation does not occur. That is, it is determined that the output impedance of the combining circuit 6 does not change.

If the time differential value calculated by the second time differential calculating unit 54 is not 0, then the load modulation determination processing unit 55 determines that load modulation occurs. That is, it is determined that the output impedance of the combining circuit 6 changes.

The load modulation determination processing unit 55 outputs a result of the determination indicating whether or not the output impedance of the combining circuit 6 changes, to the voltage setting unit 20.

In FIG. 10, it is assumed that each of the detecting unit 50, the load modulation determining unit 53, the power supply voltage control unit 18, and the fixed-voltage power supply 21 which are components of the power supply modulation device 1 is implemented by dedicated hardware such as that shown in FIG. 11. Namely, it is assumed that the power supply modulation device 1 is implemented by the detection circuit 33, the load modulation determining circuit 34, the power supply voltage control circuit 32, and the fixed-voltage power supply 21.

Each of the detection circuit 33, the load modulation determining circuit 34, and the power supply voltage control circuit 32 corresponds, for example, to a single circuit, a composite circuit, a programmed processor, a parallel programmed processor, an ASIC, an FPGA, or a combination thereof.

The components of the power supply modulation device 1 are not limited to being implemented by dedicated hardware, and a part of the power supply modulation device 1 may be implemented by software, firmware, or a combination of software and firmware.

When a part of the power supply modulation device 1 is implemented by software, firmware, or the like, a program for causing a computer to perform a processing procedure performed by each of the detecting unit 50, the load modulation determining unit 53, and the power supply voltage control unit 18 is stored in the memory 41 shown in FIG. 3. Then, the processor 42 shown in FIG. 3 executes the program stored in the memory 41.

In addition, FIG. 11 shows an example in which each of the components of the power supply modulation device 1 is implemented by dedicated hardware, and FIG. 3 shows an example in which a part of the power supply modulation device 1 is implemented by software, firmware, or the like. However, they are merely examples, and some of the detecting unit 50, the load modulation determining unit 53, and the power supply voltage control unit 18 which are components of the power supply modulation device 1 may be implemented by dedicated hardware and the other components may be implemented by software, firmware, or the like.

Figure 12:
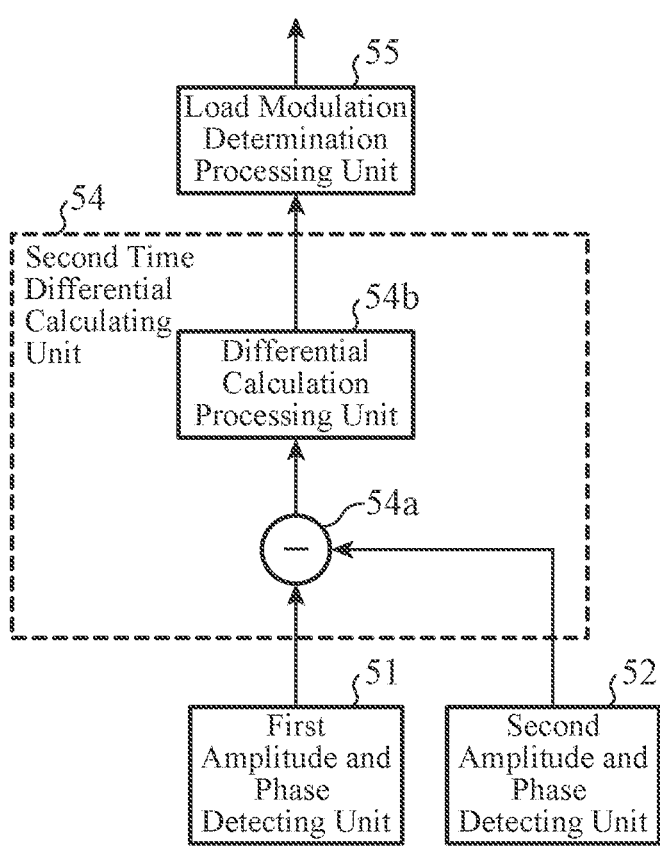
FIG. 12 is a configuration diagram showing the inside of a second time differential calculating unit 54.

FIG. 12 is a configuration diagram showing the inside of the second time differential calculating unit 54.

The second time differential calculating unit 54 includes a subtracting unit 54a and a differential calculation processing unit 54b.

The subtracting unit 54a calculates a phase difference $\Delta\theta$ between a first phase $\theta_1$ indicated by a first phase signal outputted from the first amplitude and phase detecting unit 51 and a second phase $\theta_2$ indicated by a second phase signal outputted from the second amplitude and phase detecting unit 52.

The subtracting unit 54a outputs the phase difference $\Delta\theta$ to the differential calculation processing unit 54b.

The differential calculation processing unit 54b calculates a time differential value $Del_2$ of the phase difference $\Delta\theta$ outputted from the subtracting unit 54a.

The differential calculation processing unit 54b outputs the time differential value $Del_2$ to the load modulation determination processing unit 55.

Next, operations of the power supply modulation-type amplifier shown in FIG. 10 will be described.

The power supply modulation-type amplifier shown in FIG. 10 is the same as the power supply modulation-type amplifier shown in FIG. 1 except for the detecting unit 50 and the load modulation determining unit 53, and thus, here, only operations of the detecting unit 50 and the load modulation determining unit 53 will be described.

The power supply modulation device 1 shown in FIG. 10 can suppress decrease in efficiency at a time when an out-phasing operation shown in FIG. 5 is performed.

The first amplitude and phase detecting unit 51 obtains a first digital signal provided to the first analog signal input terminal 10.

As with the first amplitude detecting unit 13 shown in FIG. 1, the first amplitude and phase detecting unit 51 detects a first amplitude $Mag_1$ which is the amplitude of a first analog signal outputted from the first DAC 2 to the first amplifier 4, on the basis of the first digital signal.

In addition, the first amplitude and phase detecting unit 51 detects a first phase $\theta_1$ which is the phase of the first analog signal, on the basis of the first digital signal. A process itself of detecting the first phase $\theta_1$ from the first digital signal is a known technique and thus a detailed description thereof is omitted.

The first amplitude and phase detecting unit 51 outputs a first amplitude signal indicating the first amplitude $Mag_1$ to the amplitude comparing unit 19, and outputs a first phase signal indicating the first phase $\theta_1$ to the second time differential calculating unit 54.

The second amplitude and phase detecting unit 52 obtains a second digital signal provided to the second analog signal input terminal 11.

As with the second amplitude detecting unit 14 shown in FIG. 1, the second amplitude and phase detecting unit 52 detects a second amplitude $Mag_2$ which is the amplitude of a second analog signal outputted from the second DAC 3 to the second amplifier 5, on the basis of the second digital signal.

In addition, the second amplitude and phase detecting unit 52 detects a second phase $\theta_2$ which is the phase of the second analog signal, on the basis of the second digital signal.

The second amplitude and phase detecting unit 52 outputs a second amplitude signal indicating the second amplitude $Mag_2$ to the amplitude comparing unit 19, and outputs a second phase signal indicating the second phase $\theta_2$ to the second time differential calculating unit 54.

The subtracting unit 54a obtains the first phase signal from the first amplitude and phase detecting unit 51 and obtains the second phase signal from the second amplitude and phase detecting unit 52.

As shown in the following equation (3), the subtracting unit 54a subtracts the first phase $\theta_1$ indicated by the first phase signal from the second phase $\theta_2$ indicated by the second phase signal, thereby calculating a phase difference $\Delta\theta$ between the phase $\theta_1$ and the phase $\theta_2$:

$$\Delta\theta=\theta_2-\theta_1 \tag{3}.$$

The subtracting unit 54a outputs the phase difference $\Delta\theta$ to the differential calculation processing unit 54b.

The differential calculation processing unit 54b obtains the phase difference $\Delta\theta$ outputted from the subtracting unit 54a.

The differential calculation processing unit 54b calculates a time differential value $Del_2$ of the phase difference $\Delta\theta$. A process itself of calculating the time differential value $Del_2$ is a known technique and thus a detailed description thereof is omitted.

The differential calculation processing unit 54b outputs the time differential value $Del_2$ to the load modulation determination processing unit 55.

If the time differential value $Del_2$ calculated by the second time differential calculating unit 54 is 0, then the load modulation determination processing unit 55 determines that load modulation does not occur. That is, it is determined that the output impedance of the combining circuit 6 does not change.

If the time differential value $Del_2$ calculated by the second time differential calculating unit 54 is not 0, then the load modulation determination processing unit 55 determines that load modulation occurs. That is, it is determined that the output impedance of the combining circuit 6 changes.

The load modulation determination processing unit 55 outputs a result of the determination J indicating whether or not the output impedance of the combining circuit 6 changes, to the voltage setting unit 20.

FIG. 13 is an explanatory diagram showing relationships between output power obtained when the power supply modulation-type amplifier shown in FIG. 10 performs an out-phasing operation, and the amplitude, phase, and the like, of each of a first analog signal and a second analog signal.

In FIG. 13, the output power is standardized and changes in a range of 0 to 1. When the output power is 0.5, a back-off point is reached.

Figure 13A:
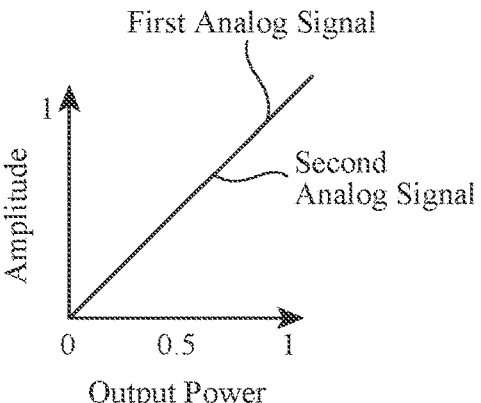
FIG. 13A is an explanatory diagram showing a relationship between the output power of the power supply modulation-type amplifier and a first amplitude $Mag_1$ of a first analog signal and a second amplitude $Mag_2$ of a second analog signal.

FIG. 13A shows a relationship between the output power of the power supply modulation-type amplifier and a first amplitude $Mag_1$ of the first analog signal and a second amplitude $Mag_2$ of the second analog signal.

Even if the output power of the power supply modulation-type amplifier changes, as shown in FIG. 13A, the first amplitude $Mag_1$ and the second amplitude $Mag_2$ are identical.

Figure 13D:
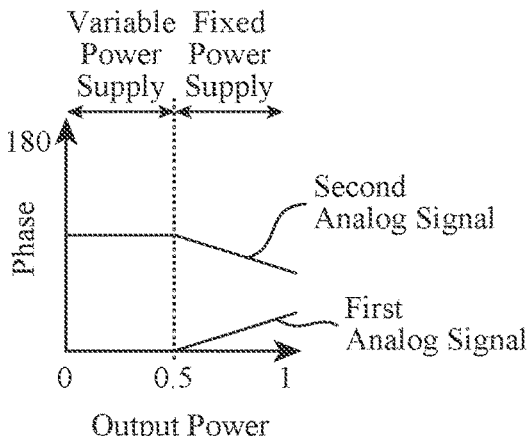
FIG. 13D is an explanatory diagram showing a relationship between the output power of the power supply modulation-type amplifier and a first phase $\theta_1$ of the first analog signal and a second phase $\theta_2$ of the second analog signal.
Figure 13B:
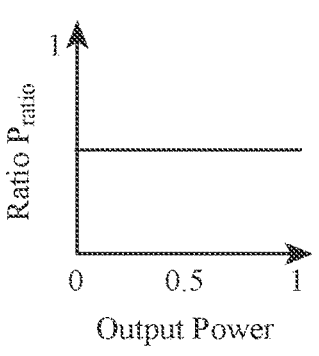
FIG. 13B is an explanatory diagram showing a relationship between the output power of the power supply modulation-type amplifier and a ratio $P_{ratio}$ of the first amplitude $Mag_1$ to an amplitude sum $\Sigma Mag$.

FIG. 13B shows a relationship between the output power of the power supply modulation-type amplifier and a ratio $P_{ratio}$ of the first amplitude $Mag_1$ to an amplitude sum $\Sigma Mag$.

Even if the output power of the power supply modulation-type amplifier changes, as shown in FIG. 13B, the ratio $P_{ratio}$ is constant.

Figure 13E:
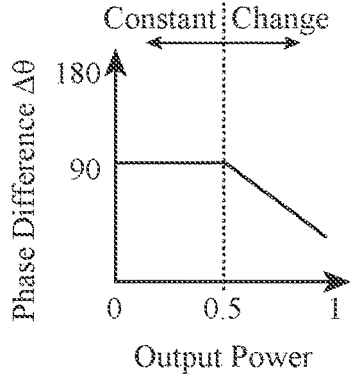
FIG. 13E is an explanatory diagram showing a relationship between the output power of the power supply modulation-type amplifier and a phase difference $\Delta\theta$.
Figure 13C:
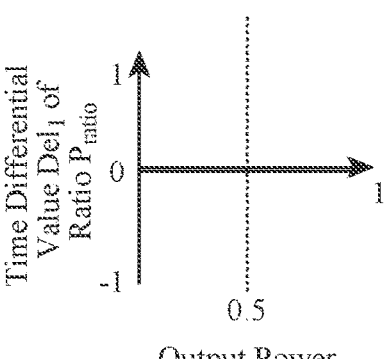
FIG. 13C is an explanatory diagram showing a relationship between the output power of the power supply modulation-type amplifier and a time differential value $Del_1$ of the ratio $P_{ratio}$.

FIG. 13C shows a relationship between the output power of the power supply modulation-type amplifier and a time differential value $Del_1$ of the ratio $P_{ratio}$.

Even if the output power of the power supply modulation-type amplifier changes, as shown in FIG. 13C, the time differential value $Del_1$ of the ratio $P_{ratio}$ is 0.

FIG. 13D shows a relationship between the output power of the power supply modulation-type amplifier and a first phase $\theta_1$ of the first analog signal and a second phase $\theta_2$ of the second analog signal.

At the time of low power with the output power being lower than the back-off point, as shown in FIG. 13D, the first phase $\theta_1$ and the second phase $\theta_2$ are constant.

At the time of high power with the output power being higher than the back-off point, as shown in FIG. 13D, the first phase $\theta_1$ increases and the second phase $\theta_2$ decreases.

FIG. 13E shows a relationship between the output power of the power supply modulation-type amplifier and a phase difference $\Delta\theta$.

At the time of low power with the output power being lower than the back-off point, as shown in FIG. 13E, the phase difference $\Delta\theta$ between the first phase $\theta_1$ and the second phase $\theta_2$ is constant.

At the time of high power with the output power being higher than the back-off point, as shown in FIG. 13E, the phase difference $\Delta\theta$ between the first phase $\theta_1$ and the second phase $\theta_2$ changes.

Figure 13F:
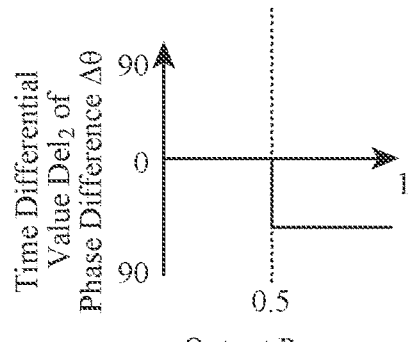
FIG. 13F is an explanatory diagram showing a relationship between the output power of the power supply modulation-type amplifier and a time differential value Deb of the phase difference $\Delta\theta$.

FIG. 13F shows a relationship between the output power of the power supply modulation-type amplifier and a time differential value $Del_2$ of the phase difference $\Delta\theta$.

At the time of low power with the output power being lower than the back-off point, as shown in FIG. 13F, the time differential value $Del_2$ of the phase difference $\Delta\theta$ is 0 and load modulation does not occur.

At the time of high power with the output power being higher than the back-off point, as shown in FIG. 13F, the time differential value $Del_2$ of the phase difference $\Delta\theta$ is not 0 and load modulation occurs.

In the second embodiment described above, the power supply modulation device 1 is configured to include the detecting unit 50 that detects, from a first digital signal, a first phase which is the phase of a first analog signal, in addition to detecting a first amplitude, and detects, from a second digital signal, a second phase which is the phase of a second analog signal, in addition to detecting a second amplitude; the load modulation determining unit 53 that calculates a time differential value of a phase difference between the first phase detected by the detecting unit 50 and the second phase detected by the detecting unit 50, and determines, on the basis of the time differential value of the phase difference, whether or not output impedance of the combining circuit 6 changes along with a change in power of a signal combined by the combining circuit 6; and the power supply voltage control unit 18 that controls a power supply voltage supplied to each of the first amplifier 4 and the second amplifier 5, on the basis of a result of the determination by the load modulation determining unit 53. Thus, the power supply modulation device 1 can suppress decrease in efficiency even when load modulation does not occur.

Third Embodiment

In a third embodiment, a power supply modulation device 1 will be described in which a load modulation determining unit 61 includes both the first time differential calculating unit 16 and the second time differential calculating unit 54.

Figure 14:
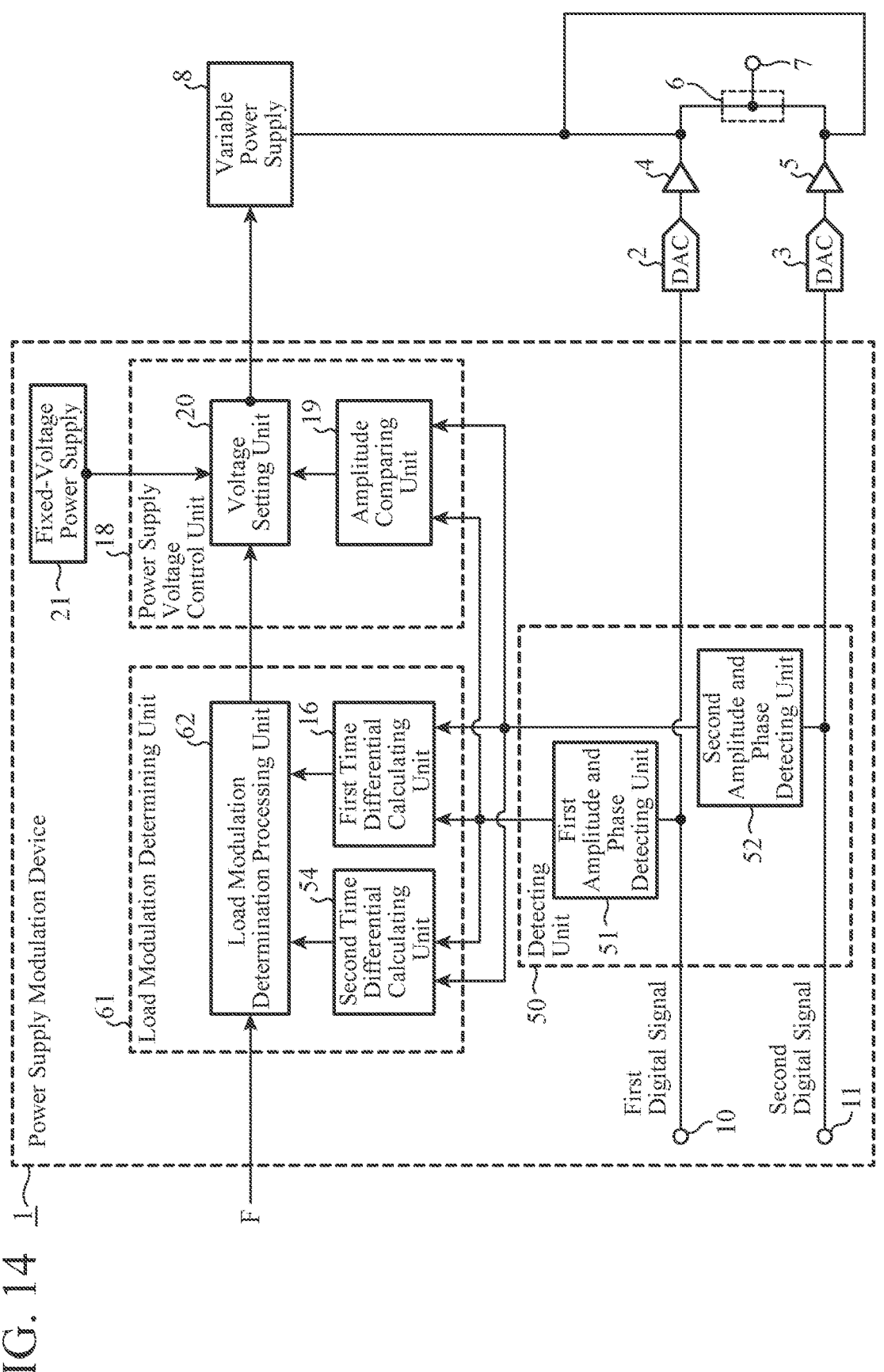
FIG. 14 is a configuration diagram showing a power supply modulation-type amplifier including a power supply modulation device 1 according to a third embodiment.

FIG. 14 is a configuration diagram showing a power supply modulation-type amplifier including the power supply modulation device 1 according to the third embodiment. In FIG. 14, the same reference signs as those of FIGS. 1 and 10 indicate the same or corresponding portions and thus description thereof is omitted.

Figure 15:
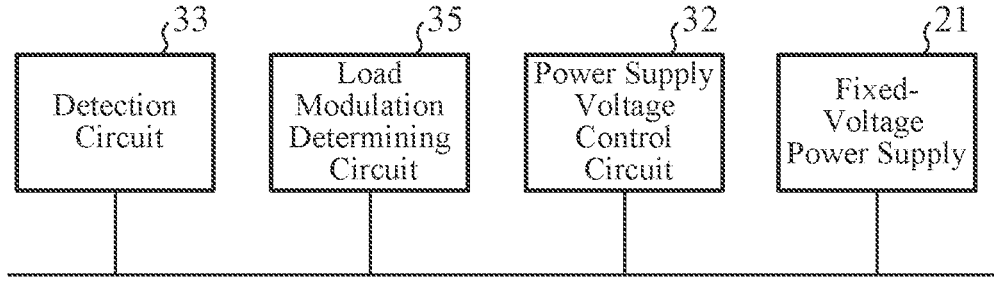
FIG. 15 is a hardware configuration diagram showing hardware of the power supply modulation device 1 according to the third embodiment.

FIG. 15 is a hardware configuration diagram showing hardware of the power supply modulation device 1 according to the third embodiment. In FIG. 15, the same reference signs as those of FIGS. 2 and 11 indicate the same or corresponding portions and thus description thereof is omitted.

The load modulation determining unit 61 is implemented by a load modulation determining circuit 35 shown in FIG. 15.

The load modulation determining unit 61 includes the first time differential calculating unit 16, the second time differential calculating unit 54, and a load modulation determination processing unit 62.

The load modulation determining unit 61 determines whether or not load modulation occurs in the power supply modulation-type amplifier shown in FIG. 14.

Namely, the load modulation determining unit 61 determines, from a first amplitude $Mag_1$ and a second amplitude $Mag_2$ or a first phase $\theta_1$ and a second phase $\theta_2$, whether or not output impedance of the combining circuit 6 changes with a change in power of a signal combined by the combining circuit 6.

The load modulation determining unit 61 outputs a result of the determination indicating whether or not the output impedance of the combining circuit 6 changes, to the power supply voltage control unit 18.

When a frequency f of each of a first analog signal and a second analog signal is a frequency at which the first amplifier 4 and the second amplifier 5 perform a Doherty operation, if a time differential value $Del_1$ calculated by the first time differential calculating unit 16 is 0, then the load modulation determination processing unit 62 determines that load modulation does not occur. That is, it is determined that the output impedance of the combining circuit 6 does not change. The frequency f at which a Doherty operation is performed is in a range between the fundamental frequency $f_0$ and the double frequency $2f_0$, inclusive. If the time differential value $Del_1$ calculated by the first time differential calculating unit 16 is not 0, then the load modulation determination processing unit 62 determines that load modulation occurs. That is, it is determined that the output impedance of the combining circuit 6 changes.

When the frequency f of each of the first analog signal and the second analog signal is a frequency at which the first amplifier 4 and the second amplifier 5 perform an out-phasing operation, if a time differential value $Del_2$ calculated by the second time differential calculating unit 54 is 0, then the load modulation determination processing unit 62 determines that load modulation does not occur. That is, it is determined that the output impedance of the combining circuit 6 does not change. The frequency f at which an out-phasing operation is performed is in a range greater than the double frequency $2f_0$ and less than or equal to the triple frequency $3f_0$. If the time differential value $Del_2$ calculated by the second time differential calculating unit 54 is not 0, then the load modulation determination processing unit 62 determines that load modulation occurs. That is, it is determined that the output impedance of the combining circuit 6 changes.

Next, operations of the power supply modulation-type amplifier shown in FIG. 14 will be described.

When the power supply modulation device 1 shown in FIG. 14 performs a Doherty operation shown in FIG. 5, the load modulation determination processing unit 62 determines whether or not load modulation occurs, on the basis of a time differential value $Del_1$ calculated by the first time differential calculating unit 16.

When the power supply modulation device 1 shown in FIG. 14 performs an out-phasing operation shown in FIG. 5, the load modulation determination processing unit 62 determines whether or not load modulation occurs, on the basis of a time differential value $Del_2$ calculated by the second time differential calculating unit 54.

The load modulation determination processing unit 62 obtains information indicating a frequency f of each of a first analog signal and a second analog signal from an external source.

If the frequency f is in a range of the fundamental frequency $f_0$ to the double frequency $2f_0$, then the load modulation determination processing unit 62 obtains a time differential value $Del_1$ of a ration $P_{ratio}$ from the first time differential calculating unit 16.

If the frequency f is in a range of the double frequency $2f_0$ to the triple frequency $3f_0$, then the load modulation determination processing unit 62 obtains a time differential value $Del_2$ of a phase difference $\Delta\theta$ from the second time differential calculating unit 54.

In the power supply modulation-type amplifier shown in FIG. 14, the load modulation determination processing unit 62 obtains information indicating the frequency f from an external source. However, this is merely an example and the load modulation determination processing unit 62 may detect a frequency f of the first analog signal or a frequency f of the second analog signal.

When the frequency f is in a range between the fundamental frequency $f_0$ and the double frequency $2f_0$, inclusive, if the time differential value $Del_1$ calculated by the first time differential calculating unit 16 is 0, then the load modulation determination processing unit 62 determines that load modulation does not occur. That is, it is determined that the output impedance of the combining circuit 6 does not change.

When the frequency f is in a range between the fundamental frequency $f_0$ and the double frequency $2f_0$, inclusive, if the time differential value $Del_1$ calculated by the first time differential calculating unit 16 is not 0, then the load modulation determination processing unit 62 determines that load modulation occurs. That is, it is determined that the output impedance of the combining circuit 6 changes.

The load modulation determination processing unit 62 outputs a result of the determination J indicating whether or not the output impedance of the combining circuit 6 changes, to the voltage setting unit 20.

When the frequency f is in a range greater than the double frequency $2f_0$ and less than or equal to the triple frequency $3f_0$, if the time differential value $Del_2$ calculated by the second time differential calculating unit 54 is 0, then the load modulation determination processing unit 62 determines that load modulation does not occur. That is, it is determined that the output impedance of the combining circuit 6 does not change.

When the frequency f is in a range greater than the double frequency $2f_0$ and less than or equal to the triple frequency $3f_0$, if the time differential value $Del_2$ calculated by the second time differential calculating unit 54 is not 0, then the load modulation determination processing unit 62 determines that load modulation occurs. That is, it is determined that the output impedance of the combining circuit 6 changes.

The load modulation determination processing unit 62 outputs a result of the determination J indicating whether or not the output impedance of the combining circuit 6 changes, to the voltage setting unit 20.

In the third embodiment described above, the power supply modulation device 1 is configured to include the load modulation determining unit 61 that determines, from a first amplitude and a second amplitude or a first phase and a second phase, whether or not output impedance of the combining circuit 6 changes along with a change in power of a signal combined by the combining circuit 6; and the power supply voltage control unit 18 that controls a power supply voltage supplied to each of the first amplifier 4 and the second amplifier 5, on the basis of a result of the determination by the load modulation determining unit 61. Thus, the power supply modulation device 1 can suppress decrease in efficiency even when load modulation does not occur at the time of a Doherty operation, and can suppress decrease in efficiency even when load modulation does not occur at the time of an out-phasing operation.

Note that in the present disclosure, a free combination of the embodiments, modifications to any component of each of the embodiments, or omissions of any component in each of the embodiments are possible.

INDUSTRIAL APPLICABILITY

The present disclosure is suitable for power supply modulation devices, power supply modulation methods, and power supply modulation-type amplifiers.

REFERENCE SIGNS LIST

1: power supply modulation device, 2: first DAC, 3: second DAC, 4: first amplifier, 5: second amplifier, 6: combining circuit, 7: output terminal, 8: variable power supply, 10: first analog signal input terminal, 11: second analog signal input terminal, 12: detecting unit, 13: first amplitude detecting unit, 14: second amplitude detecting unit, 15: load modulation determining unit, 16: first time differential calculating unit, 16*a*: adding unit, 16*b*: dividing unit, 16*c*: differential calculation processing unit, 17: load modulation determination processing unit, 18: power supply voltage control unit, 19: amplitude comparing unit, 20: voltage setting unit, 21: fixed-voltage power supply, 30: detection circuit, 31: load modulation determining circuit, 32: power supply voltage control circuit, 33: detection circuit, 34: load modulation determining circuit, 35: load modulation determining circuit, 41: memory, 42: processor, 50: detecting unit, 51: first amplitude and phase detecting unit, 52: second amplitude and phase detecting unit, 53: load modulation determining unit, 54: second time differential calculating unit, 54*a*: subtracting unit, 54*b*: differential calculation processing unit, 55: load modulation determination processing unit, 61: load modulation determining unit, 62: load modulation determination processing unit

The invention claimed is:

1. A power supply modulation device comprising processing circuitry to detect a first amplitude from a first digital signal and detect a second amplitude from a second digital signal, the first amplitude being an amplitude of a first analog signal provided to a first amplifier, and the second amplitude being an amplitude of a second analog signal provided to a second amplifier, to calculate a time differential value of a ratio of the first amplitude to a sum of the first amplitude and the second amplitude, and perform determination of, on a basis of the time differential value of the ratio, whether or not output impedance of a combining circuit to obtain a combined signal by combining together the first analog signal amplified by the first amplifier and the second analog signal amplified by the second amplifier changes along with a change in power of the combined signal obtained by the combining circuit, and to control a power supply voltage supplied to each of the first amplifier and the second amplifier, on a basis of a result of the determination.

2. The power supply modulation device according to claim 1, wherein when the processing circuitry determines that the output impedance changes, the processing circuitry fixes the power supply voltage supplied to each of the first amplifier and the second amplifier, and when the processing circuitry determines that the output impedance does not change, the processing circuitry controls the power supply voltage supplied to each of the first amplifier and the second amplifier, in accordance with a greater one of the first amplitude and the second amplitude.

3. The power supply modulation device according to claim 1, wherein the processing circuitry detects a first phase from the first digital signal and detects a second phase from the second digital signal, in addition to detecting each of the first amplitude and the second amplitude, the first phase being a phase of the first analog signal provided to the first amplifier, and the second phase being a phase of the second analog signal provided to the second amplifier, and the processing circuitry calculates a time differential value of a phase difference between the first phase and the second phase, instead of calculating the time differential value of the ratio, and determines, on a basis of the time differential value of the phase difference, whether or not the output impedance of the combining circuit changes along with a change in power of the combined signal obtained by the combining circuit.

4. The power supply modulation device according to claim 1, wherein the processing circuitry detects a first phase from the first digital signal and detects a second phase from the second digital signal, in addition to detecting each of the first amplitude and the second amplitude, the first phase being a phase of the first analog signal provided to the first amplifier, and the second phase being a phase of the second analog signal provided to the second amplifier, and the processing circuitry calculates a time differential value of a phase difference between the first phase and the second phase, in addition to calculating the time differential value of the ratio, the processing circuitry determines, on a basis of the time differential value of the ratio, whether or not the output impedance of the combining circuit changes along with a change in power of the combined signal obtained by the combining circuit, when a frequency of each of the first analog signal and the second analog signal is a frequency at which the first amplifier and the second amplifier perform a Doherty operation, and the processing circuitry determines, on a basis of the time differential value of the phase difference, whether or not the output impedance of the combining circuit changes along with a change in power of the combined signal obtained by the combining circuit, when the frequency of each of the first analog signal and the second analog signal is a frequency at which the first amplifier and the second amplifier perform an out-phasing operation.

5. The power supply modulation device according to claim 2, wherein when the processing circuitry determines that the output impedance changes, the processing circuitry fixes the power supply voltage supplied to each of the first amplifier and the second amplifier to a voltage greater than the power supply voltage supplied to each of the first amplifier and the second amplifier, in accordance with the greater one of the first amplitude and the second amplitude.

6. A power supply modulation method comprising:

detecting a first amplitude from a first digital signal and detecting a second amplitude from a second digital signal, the first amplitude being an amplitude of a first analog signal provided to a first amplifier, the second amplitude being an amplitude of a second analog signal provided to a second amplifier;

calculating a time differential value of a ratio of the first amplitude to a sum of the first amplitude and the second amplitude, and performing determination of, on a basis of the time differential value of the ratio, whether or not output impedance of a combining circuit to obtain a combined value by combining together the first analog signal amplified by the first amplifier and the second analog signal amplified by the second amplifier changes along with a change in power of the combined signal obtained by the combining circuit; and controlling a power supply voltage supplied to each of the first amplifier and the second amplifier, on a basis of a result of the determination.

7. A power supply modulation-type amplifier comprising:

a first amplifier to obtain an amplified signal by amplifying a signal corresponding to a first digital signal;

a second amplifier to obtain an amplified signal by amplifying a signal corresponding to a second digital signal;

a combining circuit to combine together the amplified signal obtained by the first amplifier and the amplified signal obtained by the second amplifier;

a variable power supply to supply a power supply voltage to each of the first amplifier and the second amplifier; and the power supply modulation device according to claim 1.

8. The power supply modulation-type amplifier according to claim 7, further comprising:

a first digital-to-analog converter to convert the first digital signal to a first analog signal and output, as the signal corresponding to the first digital signal, the first analog signal to the first amplifier; and a second digital-to-analog converter to convert the second digital signal to a second analog signal and output, as the signal corresponding to the second digital signal, the second analog signal to the second amplifier.

* * * * *